United States Patent
Wang et al.

(10) Patent No.: US 12,085,620 B2
(45) Date of Patent: Sep. 10, 2024

(54) BATTERY INSPECTION DEVICE

(71) Applicant: JRD Communication (Shenzhen) LTD., Shenzhen (CN)

(72) Inventors: Jiang Wang, Shenzhen (CN); Lianqing Xu, Shenzhen (CN)

(73) Assignee: JRD Communication (Shenzhen) LTD., Shenzhen (CN)

( * ) Notice: Subject to any disclaimer, the term of this patent is extended or adjusted under 35 U.S.C. 154(b) by 372 days.

(21) Appl. No.: 17/615,866

(22) PCT Filed: Dec. 13, 2019

(86) PCT No.: PCT/CN2019/125124
§ 371 (c)(1),
(2) Date: Dec. 2, 2021

(87) PCT Pub. No.: WO2021/109209
PCT Pub. Date: Jun. 10, 2021

(65) Prior Publication Data
US 2022/0317190 A1 Oct. 6, 2022

(30) Foreign Application Priority Data
Dec. 5, 2019 (CN) .......................... 201922164320.1

(51) Int. Cl.
*G01R 31/387* (2019.01)
*G01R 31/36* (2020.01)
*G01R 31/364* (2019.01)

(52) U.S. Cl.
CPC ......... *G01R 31/387* (2019.01); *G01R 31/364* (2019.01); *G01R 31/3644* (2013.01)

(58) Field of Classification Search
CPC . G01R 31/387; G01R 31/364; G01R 31/3644
USPC ............................................................ 702/63
See application file for complete search history.

(56) References Cited

U.S. PATENT DOCUMENTS

2005/0218902 A1* 10/2005 Restaino ............ G01R 31/3648
324/433
2013/0342213 A1 12/2013 Seol
2014/0354233 A1* 12/2014 Yazami ................ G01R 31/392
324/426
(Continued)

FOREIGN PATENT DOCUMENTS

| CN | 207051458 | 2/2018 |
| CN | 207541235 | 6/2018 |

(Continued)

OTHER PUBLICATIONS

International Search Report and the Written Opinion Dated Sep. 7, 2020 From the International Searching Authority Re. Application No. PCT/CN2019/125124 and Its Translation of Search Report Into English. (12 Pages).

*Primary Examiner* — Alesa Allgood
*Assistant Examiner* — Byung Ro Lee

(57) ABSTRACT

The present application discloses a battery inspection device. The battery inspection device includes a power supply device, at least one charging port disposed on a surface of the power supply device, at least one display light bar disposed on the surface of the power supply device, and at least one first battery connection line, wherein the first battery connection line is electrically connected to the charging port.

18 Claims, 3 Drawing Sheets

(56) References Cited

U.S. PATENT DOCUMENTS

2021/0141021 A1* 5/2021 Salo, III .................. B60L 58/16

FOREIGN PATENT DOCUMENTS

| CN | 207752124 | 8/2018 |
| --- | --- | --- |
| CN | 207947363 | 10/2018 |
| CN | 209513853 | 10/2019 |

* cited by examiner

BATTERY INSPECTION DEVICE

RELATED APPLICATIONS

This application is a National Phase of PCT Patent Application No. PCT/CN2019/125124 having International filing date of Dec. 13, 2019, which claims the benefit of priority of Chinese Patent Application No. 201922164320.1 filed on Dec. 5, 2019. The contents of the above applications are all incorporated by reference as if fully set forth herein in their entirety.

FIELD AND BACKGROUND OF THE INVENTION

The present disclosure relates to the technical field of battery technology, and particularly to a battery inspection device.

Cell phone battery fixtures currently used on the market are dedicated fixtures, whether they are laboratory battery testers or mass production equipment, including various chargers. That is, they are divided into end fixture or plane fixture according to a battery electrode design method. The two types of fixtures cannot be shared. In addition, cell phone batteries are different in length and thickness, and there are many models. Therefore, when testing or charging mobile phone batteries, it is necessary to prepare their own fixtures for various types of batteries. This causes a lot of inconvenience, increases cost of product, and is not conducive to battery maintenance.

According to analysis groups of some mobile phone battery manufacturers, there have been many cases of mobile phone users replacing new batteries at customer service outlets in the past two years. The outlets provided by the customer return first-return analysis team only use an L1/L2 maintenance manual to guide the outlets' after-sales maintenance, and there is no clear guide to standardize mobile phone battery safety inspection and maintenance standards.

In view of this, there is an urgent need for a new battery testing solution to improve and design the maintenance standards for mobile phone battery safety testing.

SUMMARY OF THE INVENTION

Embodiments of the present application provide a battery inspection device, which can effectively solve the problem of irregular battery inspection and repair by the staff of a current customer service outlets.

According to an aspect of the present application, embodiments of the present application provides a battery inspection device, comprising a power supply device; at least one charging port arranged on a surface of the power supply device; at least one display light bar arranged on a surface of the power supply device; at least one first battery connection line, wherein the first battery connection line is electrically connected to the charging port; a first connecting wire electrically connected to the charging port; an auxiliary board electrically connected with the first connecting wire; a battery connection port provided on the auxiliary board, and the battery connection port is connected to a battery to be tested; and at least one second battery connection line, wherein the second battery connection line is connected to the charging port.

Furthermore, the battery connection port is provided with a groove.

Furthermore, the battery inspection device further comprises at least one second battery connection line, wherein the second battery connection line is connected to the charging port.

According to an aspect of the present application, embodiments of the present application provides a battery inspection device, comprising a power supply device; at least one charging port arranged on a surface of the power supply device; at least one display light bar arranged on a surface of the power supply device; and at least one first battery connection line, wherein the first battery connection line is electrically connected to the charging port.

Furthermore, the first battery connection line comprises a first connecting wire electrically connected to the charging port; and an auxiliary board electrically connected with the first connecting wire, wherein a battery connection port is provided on the auxiliary board, and the battery connection port is connected to a battery to be tested.

Furthermore, the battery connection port is provided with a groove.

Furthermore, the battery inspection device further comprises at least one second battery connection line, wherein the second battery connection line is connected to the charging port.

Furthermore, the second battery connection line comprises a second connecting wire connected to the charging port; and a battery connecting fixture connected to the second connecting wire.

Furthermore, the display light bar comprises a first lamp tube, a second lamp tube and a third lamp tube, wherein the first lamp tube, the second lamp tube and the third lamp tube are arranged adjacently.

Furthermore, the first lamp tube, the second lamp tube, and the third lamp tube are all LED tubes.

Furthermore, the battery inspection device further comprises at least one test switch arranged on a surface of the power supply device.

Furthermore, the test switch is correspondly provided on a side of the display light bar.

Furthermore, the battery inspection device further comprises a power supply port arranged on a surface of the power supply device.

The advantage of the present application is that the battery detection device of the present application effectively solves the problem of waste and environmental pollution caused by the replacement of a large number of batteries caused by the irregular operation of the operators of the customer service outlets. In addition, when the battery detection device of the present application is connected to the soft pack battery, an external auxiliary board is used. For different types of soft pack batteries, only the auxiliary board needs to be replaced to meet the demand, thereby reducing the cost waste caused by upgrading the battery detection device. In addition, the test result of this application can be displayed by the display light bar, which is convenient for the operator to determine the quality of the battery.

BRIEF DESCRIPTION OF THE SEVERAL VIEWS OF THE DRAWINGS

In order to more clearly illustrate technical solutions in embodiments of the present disclosure, a brief description of accompanying drawings used in a description of the embodiments will be given below. Obviously, the accompanying drawings in the following description are merely some embodiments of the present disclosure. For those skilled in the art, other drawings may be obtained from these accompanying drawings without creative labor.

DESCRIPTION OF SPECIFIC EMBODIMENTS OF THE INVENTION

Figure 1:
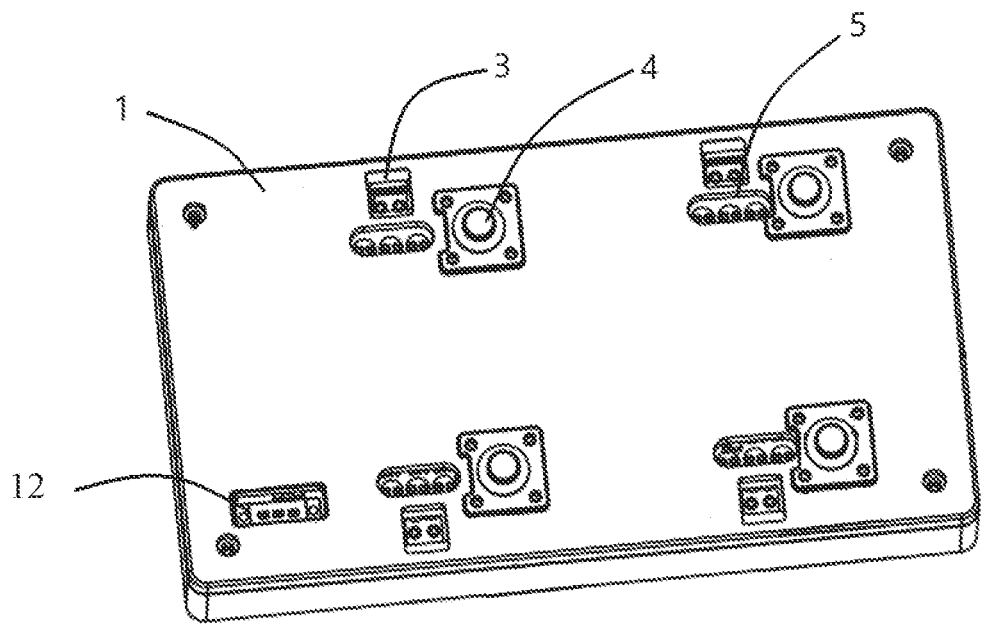
FIG. 1 is a schematic structural diagram of a battery inspection device provided in a first embodiment of the present application.

Technical solutions in embodiments of the present disclosure are clearly and completely described below in conjunction with accompanying drawings. It is apparent that the described embodiments are merely a part of the embodiments of the present disclosure and not all embodiments. All other embodiments obtained by those skilled in the art based on the embodiments of the present disclosure without creative labor are within the claimed scope of the present disclosure. In a case of no conflict, the following embodiments and their technical features can be combined with each other.

In the description of the present disclosure, it should be understood that location or position relationships indicated by terms, such as "center", "longitudinal", "transverse", "length", "width", "thickness", "up", "down", "front", "rear", "left", "right", "vertical", "horizontal", "top", "bottom", "inside", and "outside" are location or position relationships based on illustration of the accompanying drawings, are merely used for describing the present disclosure and simplifying the description instead of indicating or implying the indicated apparatuses or elements should have specified locations or be constructed and operated according to specified locations, and Thereof, should not be intercepted as limitations to the present disclosure.

Furthermore, structural elements with same or similar characteristics may be indicated by same or different reference numerals in the present disclosure. In addition, terms such as "first" and "second" are used merely for description, but shall not be construed as indicating or implying relative importance or implicitly indicating a number of the indicated technical feature. Hence, the feature defined with "first" and "second" may explicitly or implicitly includes one or more such features. In the description of the present disclosure, a term "a plurality of" means "two or more" unless otherwise specifically limited.

As shown in FIG. 1, a schematic structural diagram of a battery inspection device provided in a first embodiment of the present application is illustrated, and the first embodiment of the present application is a preferred embodiment of this application. The battery inspection device comprises a power supply device 1, at least one charging port 3, at least one display light bar 5, and at least one first battery connection line 12.

In the first embodiment of the present application, the shape of the power supply device 1 is a cuboid, which is not limited thereto. In other embodiments, the power supply device 1 may also be a cube or the like.

The length of the cuboid is 15 cm-25 cm, the width of the cuboid is 8 cm-15 cm, and the height of the cuboid is 0.5 cm-5 cm.

The number of charging port 3 in the first embodiment of the present application is four, but it is not limited to this. The charging port 3 is arranged on a surface of the power supply device 1.

Figure 2:
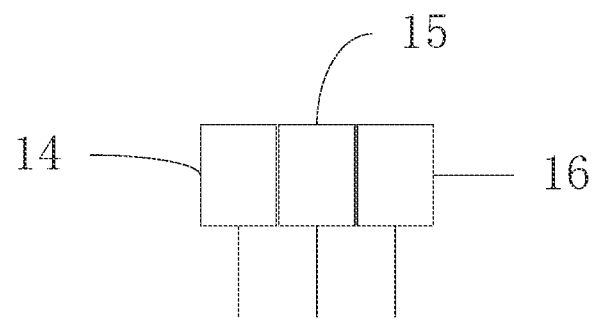
FIG. 2 is a schematic structural diagram of a display light bar provided by an embodiment of the present application.

As shown in FIG. 2, the number of the at least one display light bar 5 in the first embodiment of the present application is four, but it is not limited to this. The display light bar 5 is arranged on a surface of the power supply device 1. The display light bar 5 shown comprises a first lamp tube 14, a second lamp tube 15, and a third lamp tube 16. The first lamp tube 14, the second lamp tube 15, and the third lamp tube 16 are set adjacently. The first lamp tube 14, the second lamp tube 15, and the third lamp tube 16 are all LED lamp tubes.

Colors of the first lamp tube 14, the second lamp tube 15, and the third lamp tube 16 are different from each other. In such a setting, in order to facilitate the customer's identification, the customer only needs to determine whether the battery needs to be replaced according to the color of the light-emitting tubes.

In the first embodiment of the present application, the first lamp tube 14 is red, the second lamp tube 15 is blue, and the third lamp tube 16 is green, but is not limited to this. Colors of the lamp tubes can still be other colors in other embodiments.

Figure 3:
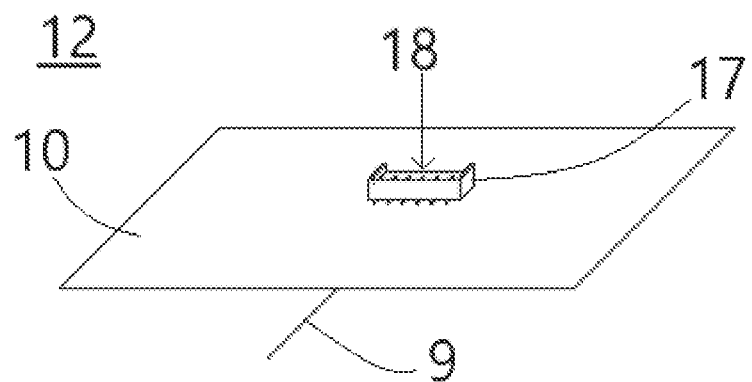
FIG. 3 is a schematic structural diagram of a first battery connection line provided by an embodiment of the present application.

As shown in FIG. 3, each of the first battery connection lines 12 is electrically connected to a charging port 3. The first battery connection line 12 comprises a first connecting wire 9 and an auxiliary board 10. The first battery connection line 12 is used to connect a soft pack battery.

The first connecting wire 9 is electrically connected to the charging port 3. The auxiliary board 10 is electrically connected to the first connecting wire 9. A battery connection port 17 is provided on the auxiliary board 10, and the battery connection port 17 is connected to a battery to be tested. The battery connection port 17 is provided with a groove 18.

Figure 4:
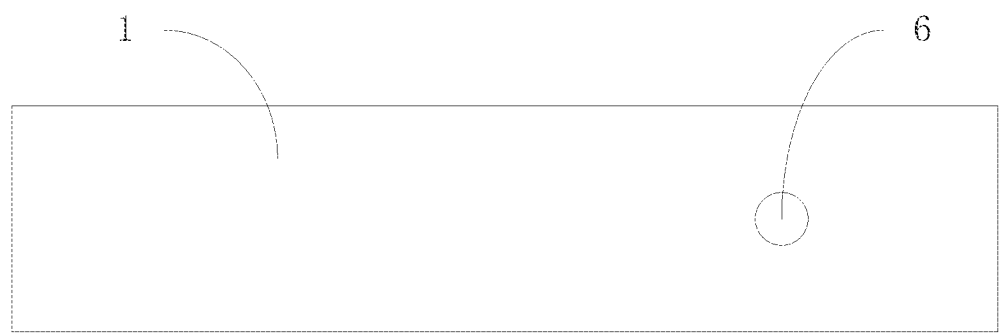
FIG. 4 is a side view of a battery inspection device provided by an embodiment of the present application.

As shown in FIG. 1 and FIG. 4, the battery inspection device further comprises at least one test switch 4 (see FIG. 1) and a power supply port 6 (see FIG. 4).

In the first embodiment of the present application, there are four test switches 4, which respectively control the four charging ports 3, and the four display light bars 5 respectively display the current voltage conditions of the batteries to be tested connected to different charging ports 3.

The test switch 4 is provided on one side of each display light bar 5, and this setting is convenient for users to observe.

The power supply port 6 is arranged on a surface of the power supply device. In the first embodiment of the present application, the power supply port 6 is arranged on a side of the power supply device, but it is not limited thereto.

Figure 5:
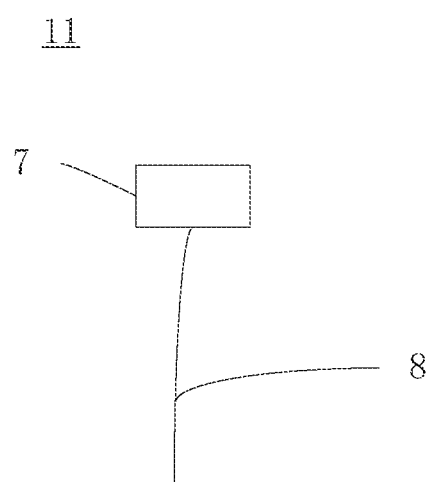
FIG. 5 is a schematic structural diagram of a second battery connection line provided by an embodiment of the present application.

As shown in FIG. 5, the battery inspection device further comprises at least one second battery connection line 11. Each of the second battery connection line 11 is connected to one of the charging ports 3. The second battery connection line 11 comprises a second connecting wire 7 and a battery connecting fixture 8. The second battery connection line 11 is used to connect a hard pack battery.

The second connecting wire 7 is connected to the charging port 3. The battery connecting fixture 8 is connected to the second connecting wire 7. The battery connecting fixture 8 can be a universal charger.

In the actual working process, when a battery under test is connected to the power supply device 1 through the first battery connection line 12 or the second battery connection line 11, a voltage value the battery under test is inspected by the internal voltage inspection module of the power supply device 1. In a first test phase, when the voltage is less than 3.1V, the red light (the first lamp tube 14) is on. When the voltage is greater than or equal to 3.1V and less than 3.65V, the blue light (the second lamp tube 15) is on. When the voltage is greater than or equal to 3.65V, the green light (the third lamp tube 16) is on. At this time, the battery to be tested with the green light is a reusable battery.

When the red light in the first test phase is on, the test switch 4 corresponding to the display light bar 5 where the red light is located needs to be activated. When the test switch 4 is turned on and the red light is still on, it indicates that the battery under the test needs to be replaced. If the test switch is activated and the blue light is on, it is needed to wait for a while (waiting for the battery to be fully charged, generally taking 15 minutes). If the blue light is still on after waiting for a period of time, it means that the battery under test is in an unchargeable state and the battery is needs to be replaced. If the green light turns on after waiting for a period of time, it means that the battery to be tested is a reusable battery.

When the blue light in the first test phase is on, the test switch 4 corresponding to the display light bar 5 where the blue light is located needs to be activated. When the test switch 4 is turned on and the blue light is still on, it is needed to wait for a while (waiting for the battery to be fully charged, usually taking 15 minutes). If the blue light is still on after waiting for a period of time, it means that the battery under test is in an unchargeable state and the battery needs to be replaced. If the green light turns on after waiting for a period of time, it means that the battery to be tested is a reusable battery.

The advantage of the first embodiment of the present application is that the battery detection device of the present application effectively solves the problem of waste and environmental pollution caused by the replacement of a large number of batteries caused by the irregular operation of the operators of the customer service outlets. In addition, when the battery detection device of the present application is connected to the soft pack battery, an external auxiliary board is used. For different types of soft pack batteries, only the auxiliary board needs to be replaced to meet the demand, thereby reducing the cost waste caused by upgrading the battery detection device. In addition, the test result of this application can be displayed by the display light bar, which is convenient for the operator to determine the quality of the battery.

Figure 6:
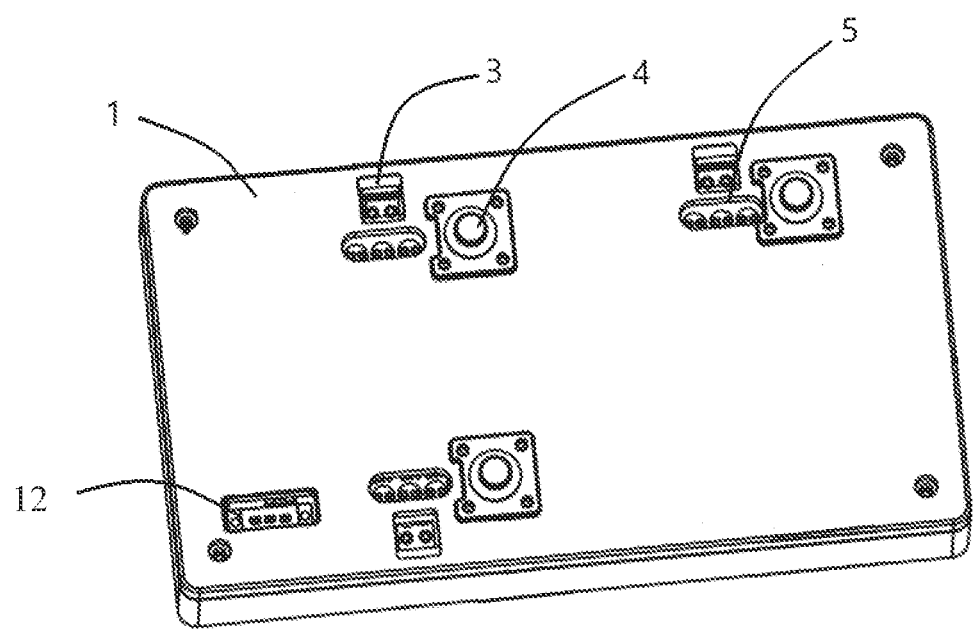
FIG. 6 is a schematic structural diagram of a battery inspection device provided in a second embodiment of the application.

As shown in FIG. 6, a schematic structural diagram of a battery inspection device provided in a second embodiment of the present application is illustrated. The battery inspection device comprises a power supply device 1, at least one charging port 3, at least one display light bar 5, and at least one first battery connection line 12.

In the second embodiment of the present application, the shape of the power supply device 1 is a cuboid, which is not limited thereto. In other embodiments, the power supply device 1 may also be a cube or the like.

The length of the cuboid is 15 cm-25 cm, the width of the cuboid is 8 cm-15 cm, and the height of the cuboid is 0.5 cm-5 cm.

The number of charging port 3 in the first embodiment of the present application is three, but it is not limited to this. The charging port 3 is arranged on a surface of the power supply device 1.

As shown in FIG. 6, the number of the at least one display light bar 5 in the first embodiment of the present application is three, but it is not limited to this. The display light bar 5 is arranged on a surface of the power supply device 1. The display light bar 5 shown comprises a first lamp tube 14, a second lamp tube 15, and a third lamp tube 16. The first lamp tube 14, the second lamp tube 15, and the third lamp tube 16 are set adjacently. The first lamp tube 14, the second lamp tube 15, and the third lamp tube 16 are all LED lamp tubes.

Colors of the first lamp tube 14, the second lamp tube 15, and the third lamp tube 16 are different from each other. In such a setting, in order to facilitate the customer's identification, the customer only needs to determine whether the battery needs to be replaced according to the color of the light-emitting tubes.

In the second embodiment of the present application, the first lamp tube 14 is red, the second lamp tube 15 is blue, and the third lamp tube 16 is green, but is not limited to this. Colors of the lamp tubes can still be other colors in other embodiments.

As shown in FIG. 3, each of the first battery connection lines 12 is electrically connected to a charging port 3. The first battery connection line 12 comprises a first connecting wire 9 and an auxiliary board 10. The first battery connection line 12 is used to connect a soft pack battery.

The first connecting wire 9 is electrically connected to the charging port 3. The auxiliary board 10 is electrically connected to the first connecting wire 9. A battery connection port 17 is provided on the auxiliary board 10, and the battery connection port 17 is connected to a battery to be tested. The battery connection port 17 is provided with a groove 18.

As shown in FIG. 6 and FIG. 4, the battery inspection device further comprises at least one test switch 4 (see FIG. 6) and a power supply port 6 (see FIG. 4).

In the second embodiment of the present application, there are three test switches 4, which respectively control the three charging ports 3, and the three display light bars 5 respectively display the current voltage conditions of the batteries to be tested connected to different charging ports 3.

The test switch 4 is provided on one side of each display light bar 5, and this setting is convenient for users to observe.

The power supply port 6 is arranged on a surface of the power supply device. In the second embodiment of the present application, the power supply port 6 is arranged on a side of the power supply device, but it is not limited thereto.

As shown in FIG. 5, the battery inspection device further comprises at least one second battery connection line 11. Each of the second battery connection line 11 is connected to one of the charging ports 3. The second battery connection line 11 comprises a second connecting wire 7 and a battery connecting fixture 8. The second battery connection line 11 is used to connect a hard pack battery.

The second connecting wire 7 is connected to the charging port 3. The battery connecting fixture 8 is connected to the second connecting wire 7. The battery connecting fixture 8 can be a universal charger.

In the actual working process, when a battery under test is connected to the power supply device 1 through the first battery connection line 12 or the second battery connection line 11, a voltage value the battery under test is inspected by the internal voltage inspection module of the power supply device 1. In a first test phase, when the voltage is less than 3.1V, the red light (the first lamp tube 14) is on. When the voltage is greater than or equal to 3.1V and less than 3.65V, the blue light (the second lamp tube 15) is on. When the voltage is greater than or equal to 3.65V, the green light (the third lamp tube 16) is on. At this time, the battery to be tested with the green light is a reusable battery.

When the red light in the first test phase is on, the test switch 4 corresponding to the display light bar 5 where the red light is located needs to be activated. When the test switch 4 is turned on and the red light is still on, it indicates that the battery under test needs to be replaced. If the test switch is activated and the blue light is on, it is needed to wait for a while (waiting for the battery to be fully charged, generally taking 15 minutes). If the blue light is still on after waiting for a period of time, it means that the battery under test is in an unchargeable state and the battery needs to be replaced. If the green light turns on after waiting for a period of time, it means that the battery to be tested is a reusable battery.

When the blue light in the first test phase is on, the test switch 4 corresponding to the display light bar 5 where the blue light is located needs to be activated. When the test switch 4 is turned on and the blue light is still on, it is needed to wait for a while (waiting for the battery to be fully charged, usually taking 15 minutes). If the blue light is still on after waiting for a period of time, it means that the battery under test is in an unchargeable state and the battery needs to be replaced. If the green light turns on after waiting for a period of time, it means that the battery to be tested is a reusable battery.

The advantage of the second embodiment of the present application is that the battery detection device of the present application effectively solves the problem of waste and environmental pollution caused by the replacement of a large number of batteries caused by the irregular operation of the operators of the customer service outlets. In addition, when the battery detection device of the present application is connected to the soft pack battery, an external auxiliary board is used. For different types of soft pack batteries, only the auxiliary board needs to be replaced to meet the demand, thereby reducing the cost waste caused by upgrading the battery detection device. In addition, the test result of this application can be displayed by the display light bar, which is convenient for the operator to determine the quality of the battery.

Accordingly, although the present invention has been illustrated and described with respect to one or more implementations, equivalent alterations and modifications will occur to those skilled in the art based on a reading and understanding of the present disclosure and the accompanying drawings. The present invention comprises all such modifications and alterations and is limited only by the scope of the following claims.

What is claimed is:

1. A battery inspection device, comprising:
   a power supply device;
   at least one charging port arranged on a surface of the power supply device;
   at least one display light bar arranged on the surface of the power supply device, wherein the at least one display light bar comprises a first lamp tube, a second lamp tube, and a third lamp tube;
   at least one first battery connection line, wherein the first battery connection line is electrically connected to the charging port;
   a first connecting wire electrically connected to the charging port;
   an auxiliary board electrically connected with the first connecting wire; and
   a battery connection port provided on the auxiliary board, and the battery connection port is connected to a battery to be tested;
   wherein in a first test phase, when the power supply device detects that a voltage of the battery to be tested is less than 3.1 V, a red light of the first lamp tube turns on; when the power supply device detects that the voltage of the battery to be tested is greater than or equal to 3.1 V and less than 3.65 V, a blue light of the second lamp tube turns on; when the power supply device detects that the voltage of the battery to be tested is greater than or equal to 3.65 V, a green light of the third lamp tube turns on, and the battery to be tested with the green light is a reusable battery.

2. The battery inspection device of claim 1, wherein the battery connection port is provided with a groove.

3. The battery inspection device of claim 1, wherein the battery inspection device further comprises:
   at least one second battery connection line, wherein the second battery connection line is connected to the charging port.

4. The battery inspection device according to claim 1, wherein the first lamp tube, the second lamp tube, and the third lamp tube are arranged adjacently.

5. The battery inspection device of claim 4, wherein the first lamp tube, the second lamp tube, and the third lamp tube are all LED tubes.

6. The battery inspection device according to claim 1, wherein the battery inspection device further comprises:
   at least one test switch arranged on the surface of the power supply device.

7. The battery inspection device of claim 6, wherein the test switch is correspondingly provided on a side of the at least one display light bar.

8. The battery inspection device of claim 1, wherein the battery inspection device further comprises:
   a power supply port arranged on the surface of the power supply device.

9. A battery inspection device, comprising:
   a power supply device;
   at least one charging port arranged on a surface of the power supply device;
   at least one display light bar arranged on the surface of the power supply device, wherein the at least one display light bar comprises a first lamp tube, a second lamp tube, and a third lamp tube; and
   at least one first battery connection line, wherein the first battery connection line is electrically connected to the charging port;
   wherein in a first test phase, when the power supply device detects that a voltage of the battery to be tested is less than 3.1 V, a red light of the first lamp tube turns on; when the power supply device detects that the voltage of the battery to be tested is greater than or equal to 3.1 V and less than 3.65 V, a blue light of the second lamp tube turns on; when the power supply device detects that the voltage of the battery to be tested is greater than or equal to 3.65 V, a green light of the third lamp tube turns on, and the battery to be tested with the green light is a reusable battery.

10. The battery inspection device according to claim 9, wherein the first battery connection line comprises:

a first connecting wire electrically connected to the charging port; and an auxiliary board electrically connected with the first connecting wire; and a battery connection port provided on the auxiliary board, wherein the battery connection port is connected to a battery to be tested.

11. The battery inspection device of claim 10, wherein the battery connection port is provided with a groove.

12. The battery inspection device of claim 9, wherein the battery inspection device further comprises:

at least one second battery connection line, wherein the second battery connection line is connected to the charging port.

13. The battery inspection device of claim 12, wherein the second battery connection line comprises:

a second connecting wire connected to the charging port; and a battery connecting fixture connected to the second connecting wire.

14. The battery inspection device according to claim 9, wherein the first lamp tube, the second lamp tube and the third lamp tube are arranged adjacently.

15. The battery inspection device of claim 14, wherein the first lamp tube, the second lamp tube, and the third lamp tube are all LED tubes.

16. The battery inspection device according to claim 9, wherein the battery inspection device further comprises:

at least one test switch arranged on the surface of the power supply device.

17. The battery inspection device of claim 16, wherein the test switch is correspondingly provided on a side of the at least one display light bar.

18. The battery inspection device of claim 9, wherein the battery inspection device further comprises:

a power supply port arranged on the surface of the power supply device.

* * * * *